United States Patent
De Leeuw et al.

(10) Patent No.: US 6,818,920 B2
(45) Date of Patent: Nov. 16, 2004

(54) INTEGRATED CIRCUIT PROVIDED WITH A SUBSTRATE AND MEMORY TRANSPONDER

(75) Inventors: Dagobert Michel De Leeuw, Eindhoven (NL); Cornelis Maria Hart, Eindhoven (NL); Gerwin Hermanus Gelinck, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/817,107

(22) Filed: Mar. 26, 2001

(65) Prior Publication Data

US 2001/0045593 A1 Nov. 29, 2001

(30) Foreign Application Priority Data

Mar. 28, 2000 (EP) .............................. 00201113

(51) Int. Cl.⁷ .................... H01L 23/58; H01L 23/02
(52) U.S. Cl. ............................... 257/48; 257/679
(58) Field of Search ................. 257/48, 679, 922, 257/40

(56) References Cited

U.S. PATENT DOCUMENTS 6,159,842 A  * 12/2000  Chang et al. .............. 438/622
6,404,643 B1 *  6/2002  Chung ...................... 361/737
6,601,770 B1 *  8/2003  Ikefuji et al. .............. 235/492

FOREIGN PATENT DOCUMENTS

WO        1B9801843        11/1998

* cited by examiner

Primary Examiner—Amir Zarabian
Assistant Examiner—Kiesha Rose
(74) Attorney, Agent, or Firm—Kevin Simons

(57) ABSTRACT

The integrated circuit (10) has a substrate and a memory with a first memory unit (30) containing organic material. The first memory unit (30) has a first (26) and a second electrode (28), which are in the non-programmed state electrically connected by an interconnection (27). On programming, the interconnection (27) is at least partially broken in that it is locally heated. This heating can be effected electrically and optically. By preference the first memory unit (30) is integrated in a first layer (6) of organic material, which also has a first electrode (25) of the integrated circuit (10). The integrated circuit (10) can be used in a transponder which is electrically programmable. In the method of programming, the local heating is effected electrically, by applying a voltage across the first memory unit (30).

11 Claims, 4 Drawing Sheets

INTEGRATED CIRCUIT PROVIDED WITH A SUBSTRATE AND MEMORY TRANSPONDER

The invention relates to an integrated circuit provided with a substrate and with a memory having a first programmable memory element, which memory element
- comprises an electrically conducting organic material,
- has a non-programmed and a programmed state, and
- comprises a first electrode and a second electrode.

The invention also relates to a transponder comprising an integrated circuit, and an antenna. The invention further relates to a security paper comprising an integrated circuit.

The invention further relates to a method of programming a memory in an integrated circuit, which memory comprises a first programmable memory element, which memory element comprises an electrically conducting organic material, has a non-programmed and a programmed state, and comprises a first electrode and a second electrode.

Such an integrated circuit is known from WO-A-99/30432. The known circuit has a 15-bit memory. The memory comprises a code generator provided with 15 programmable paths. The memory is programmed in that a vertical interconnect area, a "via", is locally provided between two electrically conducting layers. The via is mechanically created in that the layers are compressed with the point of a needle, i.e. the vertical interconnect area is notched by means of a tool tip. Part of the integrated circuit is short-circuited thereby. The result is that a bit with value "0" is given a value "1" or vice versa. An integrated circuit is also referred to as an "IC" hereinafter. The circuit is used in a transponder which comprises besides the IC an antenna and a first connection between the IC and the antenna.

It is a disadvantage of the known IC that programming takes place mechanically. This method of programming requires special equipment, because a via is to be created locally by means of pressure. This method is liable to defects because of the positioning of the first memory element with respect to the equipment. Furthermore, programming of the memory is difficult to perform after the manufacture of the IC; it is necessary for the flexible IC to be mounted on a rigid support if the pressure is to be applied. Such a fastening is present during manufacture, but not afterwards.

It is a first object of the invention to provide an integrated circuit of the kind described in the opening paragraph which can be programmed in a simple manner.

It are second and third objects of the invention to provide a transponder and a security paper of the kind described in the preamble whose integrated circuit can be easily programmed after its manufacture has been completed.

It is a fourth object of the invention to provide a method of the kind described in the preamble by means of which the memory of the integrated circuit can be programmed also after the manufacture of the memory has been completed.

The first object is achieved in that
- the first and the second electrode are interconnected in the non-programmed state by an electrically conducting bridge which comprises the organic material,
- said bridge is at least partly interrupted in the programmed state, and
- the first memory element is programmable through heating of the organic material.

The result of programming of the IC according to the invention is inter alia a reduction in the conduction through the first memory element, so that electrical reading of the first memory element detects a transition from "1" to "0". The reduction in conduction is caused by the at least partial interruption of the bridge. That is to say, a cross-section through the bridge transverse to the longitudinal direction of the bridge will be smaller after programming than it was originally. Alternatively, the bridge may be fully interrupted. The temperature in the bridge will have risen to at least a transition temperature of the organic material during the interruption process.

It is an advantage of the IC according to the invention that it can be programmed much more quickly than the known IC. The first memory element can be programmed in a few microseconds. Even supposing that a few hundreds of memory elements are to be programmed in succession, the IC can still be programmed in one to only a few seconds.

The energy required for heating may be supplied optically and electrically. Preferably, the first memory element is programmed electrically. The inventors have in fact found that electrically conducting organic materials after doping have the property that their resistivity rises with temperature. Examples of such organic materials, which are preferably built up from repetitive units, are: pentacene, polyaniline, polythiophene, poly(3-4-dialkyl-2,2'-bithiophene), polypyrrole, poly(p-phenylenesulfide), polythienylene-vinylene, polyfuranylene-vinylene, polyDOT, and copolymers of the monomers of the above. Substituted variants of these materials, for example with alkyl, alkoxy, alkylalkoxy, or cyclic groups, may also be used.

In an embodiment of the IC according to the invention, a first transistor is present which during programming provides a voltage across the first memory element so as to heat the first memory element. The first transistor may be connected as a diode here. The first transistor is preferably connected in series with the first memory element, which series arrangement is present between a first bit line and a first word line. The first bit line and the first word line are both electrical conductor tracks which form part of respective patterned layers. Any further bit lines, word lines, and other lines which may be present, such as one or several supply lines, are also electrical conductor tracks which form part of patterned layers. The first transistor is important for selectively programming the first memory element. If the memory is a matrix of word and bit lines with interposed series circuits, the memory elements should be programmable independently of one another. The first transistor provides the first memory element with an input and an output, such that a current can flow in one direction only. While the first memory element is being programmed, no current circuit with a further series arrangement of a further memory element at a further transistor is possible between the first bit line and the first word line. The first memory element is thus independently programmable.

During electrical programming of the first memory element, heating of the bridge takes place by means of heat dissipated by passage of current through the first memory element. If the electrical programming is to take place efficiently, the heat dissipated in the bridge should not be capable of flowing away to any appreciable extent. One or several of the following measures may be taken for limiting the removal of heat from the bridge.

A first measure is that an electrical conductor track is present, perpendicular projections of said conductor track and of the bridge on the substrate overlapping each other. A perpendicular projection of the electrical conductor track on the substrate has an overlap with a perpendicular projection of the bridge on the substrate. This conductor track dissipates heat when a current is passed through it, as does any conductor track. In this manner, the conductor track ensures a heating-up of portions of the IC around the bridge. The temperature difference between the bridge and the surrounding portions is reduced, with the result that there will be a reduced heat transfer from the bridge to the surrounding portions.

A second measure is that the first memory element has a spiraling or meandering shape. There will be a smaller distance between a first and a second point of the element in perpendicular direction than longitudinally along the element in a spiraling or meandering element. The possibility of heat dissipation from the first point is smaller in the spiraling or meandering element than in an elongate element, because heat will be dissipated also at the adjacent second point in the first layer. As a result, the temperature in the spiraling or meandering element will rise more quickly during programming. Programming thus proceeds more efficiently. It is an additional advantage of this measure that the first memory element has a compact configuration accompanied by a great length.

A third measure relates to the choice of the substrate. Preferably, the substrate is a laminate of a porous layer and a covering layer which is present between the porous layer and the first patterned layer. An IC with a substrate provided with a porous layer is favorable because this substrate compared with a non-porous substrate of the same thickness has a smaller mass to which heat is dissipated from the first memory element. In addition, the use of a laminate as the substrate offers the advantage that material properties of the porous layer can be combined with material properties of the covering layer. Examples of materials which may be used as materials for the porous layer are poly(etherimide) and polysulfon. An example of a material which can be used for the covering layer is polyvinylphenol. This material is electrically insulating and can be planarized. It is accordingly highly suitable as a substrate for field effect transistors which comprise organic material.

It is favorable when the first memory element is programmable by optical means. It may be favorable in the case of transponders or smart cards, with which persons can identify themselves or objects can be identified, that data are laid down in the memory already during or after manufacture. It may then be that a change in the data takes place subsequently in that the first or a subsequent memory element in the memory is programmed. electrically This electrical programming may be done by a user, who thus obtains a personal identification code. The option of optical programmability may be achieved, for example, in an IC in which the first memory element lies directly on the substrate. The substrate in that case is transmissive to radiation of a chosen wavelength, in particular radiation emitted in a laser beam.

In a favorable embodiment, the bridge forms part of a first patterned layer which comprises the electrically conducting organic material and which at the same time comprises the first electrode of the first memory element. Examples of organic materials which may be used, after doping, as materials for the first patterned layer are inter alia polyaniline, polythiophene, poly(3-4-dialkyl-2,2'-bithiophene), polypyrrole, poly(p-phenylenesulfide), and copolymers of the monomers of the above. Other materials which may be used are substituted variants of these materials, for example with alkyl, alkoxy, alkylalkoxy, or cyclic groups.

Preferably, an acid or a polyacid is present as a dopant in the first patterned layer in addition to the electrically conducting organic material. Examples of acids are inter alia camphorsulfonic acid, m-cresol, trifluoroacetic acid, perfluorocaprylic acid, picric acid, perchloric acid, p-toluenesulfonic acid, dodecylbenzenesulfonic acid, benzenesulfonic acid, $BF_3$. Polyacids preferably have a polymeric chain comprising a vinyl group. Such a chain is built up from structural units of the general formula —$(CH_2CHX)$—, in which X is an acid group or a substituent substituted with an acid group. Examples of polyacids are inter alia poly(styrenesulfonic acid), poly(acrylic acid), poly(methacrylic acid), poly(vinylsulfonic acid), poly(vinylsulfuric acid), poly(vinylboric acid), poly(styreneboric acid), poly(vinylphosphoric acid), and poly(styrenephosphoric acid). Additives such as oxalic acid, polyethyleneglycol, and similar substances may be present.

It is furthermore favorable when a first transistor electrode is present in the first patterned layer. This has the advantage that no supplementary exposure step or deposition step is necessary for manufacturing the first memory element.

If the first transistor electrode, the bridge of the first memory element, and other conductor tracks lie in the same layer and accordingly have the same composition, the first transistor electrode and the other conductor tracks must not be interrupted or suffer a substantial decrease in their conductivity during programming.

In a specific embodiment, the bridge is for this purpose embodied as conductive track, with a smaller width than the first transistor electrode. The width of the conductor track is defined here as the dimension thereof transverse to the current flow direction. Preferably, the ratio of the width of the first transistor electrode to the width of the bridge is greater than two. A second transistor electrode may be present in the first layer in addition to a first transistor electrode, said transistor electrodes being mutually separated by a channel. In a favorable embodiment thereof, the two transistor electrodes have finger-shaped portions which are interdigitated. The width of a finger-shaped portion of the first transistor electrode need not be greater than the width of the bridge.

Preferably, the width of the bridge is also smaller than the width of the first electrode of the first memory element. It is advantageous if there is a gradual transition from the width of the bridge to the widths of the electrodes of the memory element. The dissipation of heat from the first patterned layer to the layers in contact therewith is smaller as a result. The smaller heat dissipation speeds up the programming of the first memory element.

Preferably, the first patterned layer, which comprises at least portions of the first memory element and the first transistor electrode, comprises poly(3,4-ethylenedioxythiophene) or polyaniline as the organic material. These materials have a conductivity of more than 50 S/cm at room temperature already, which renders them suitable for use as an electrode material. In addition, the resistivity of these materials rises considerably upon a rise in temperature, so that programming may be readily achieved.

In a further embodiment, the IC according to the invention comprises not only a first patterned layer of organic material but also a semiconductor of organic material and an electrically insulating organic material. Examples of such materials have been mentioned above. These materials have the advantage that they are inexpensive. In addition, the manufacture of an integrated circuit with organic materials is simple and cheap because the layers can be provided through coating of the substrate with a solution and because the first layer can be patterned without the use of a resist layer. Methods of manufacturing relief-patterned, electrically conducting layers are described inter alia in WO-A-99/10939 and in the application EP 99203636.8 (PHN 17732) not previously published. In a specific embodiment, the IC is entirely composed of organic materials. An advantage of this embodiment is the simplification of an indetachable incorporation in a synthetic-resin appliance.

The second object of the invention is achieved in that the integrated circuit as claimed in claim 1 is present. This renders the transponder according to the invention electrically programmable. This is a major advantage because transponders can be integrated into objects in daily use of various kinds and in packagings. The transponder according to the invention may be used inter alia for identification purposes. Signals and power may be received in a contactless manner through the antenna from a base station. The antenna may be constructed, for example, as a coil and as a capacitor electrode, in which cases the communication with the base station takes place through inductive and through capacitive coupling, respectively. From the antenna signals and power are transferred to the integrated circuit, for example through capacitive coupling or through electrically conducting connections. A first advantage of transponders entirely or partly made of organic material is that they are basically flexible and continue to operate when the transponder is bent. A second advantage is that the manufacturing cost is low.

In a favorable embodiment, the antenna is present in a layer of electrically conducting material on a second substrate, which layer further comprises a first and a second contact pad. In this embodiment, the IC lies on the first substrate, on which substrate are furthermore present a third and a fourth contact pad which are uncovered and are integrated into an electrically conducting layer of the IC. The contact pads are positioned such that the first and the third contact pad are in contact with one another, as are the second and the fourth contact pad. Electrically conducting connections between the IC and the antenna are achieved by means of these mutual connections. This embodiment is favorable because the number of layers is very small. In addition, the first substrate may be constructed as a stack of a porous layer and a covering layer.

The third object of the invention is achieved in that the integrated circuit is present. This renders the security paper 37, as shown in FIGS. 6A and 6B to be electrically programmable. Security paper includes banknotes, paper meant for passports, entry tickets and other official documents and the like. In the context of the application, paper is understood to mean paper which is made from natural or synthetic fibers, as well as "paper" which can nowadays be produced from plastic film. Preferably, the integrated circuit comprises an organic semiconductor, as disclosed in WO-A 99154842. The security paper may further contain other security features, such as watermarks, security threads, hologram and the like. Signals and power may be received in a contactless manner through the antenna from a base station.

The fourth object of the invention is achieved in that
  the first and the second electrode are interconnected in the non-programmed state by means of an electrically conducting bridge, and
  said bridge is at least partly interrupted through the application of a voltage across the first memory element.

An IC which comprises organic material at least in part can be electrically programmed by this method of programming a memory in an integrated circuit according to the invention. Electrical programming is preferred to other programming methods because no positioning of a programming device is necessary for programming and because programming can take place within a short period.

These and other aspects of the integrated circuit and of the transponder according to the invention will be explained in more detail below with reference to drawings which are not true to scale and in which.

Figure 1:
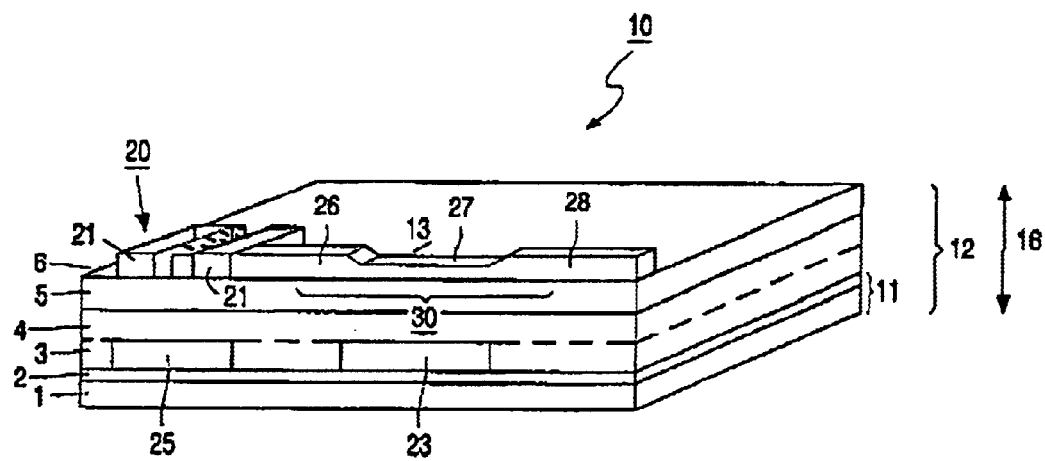
FIG. 1 is a diagrammatic perspective view of a first embodiment of the integrated circuit.
Figure 2:
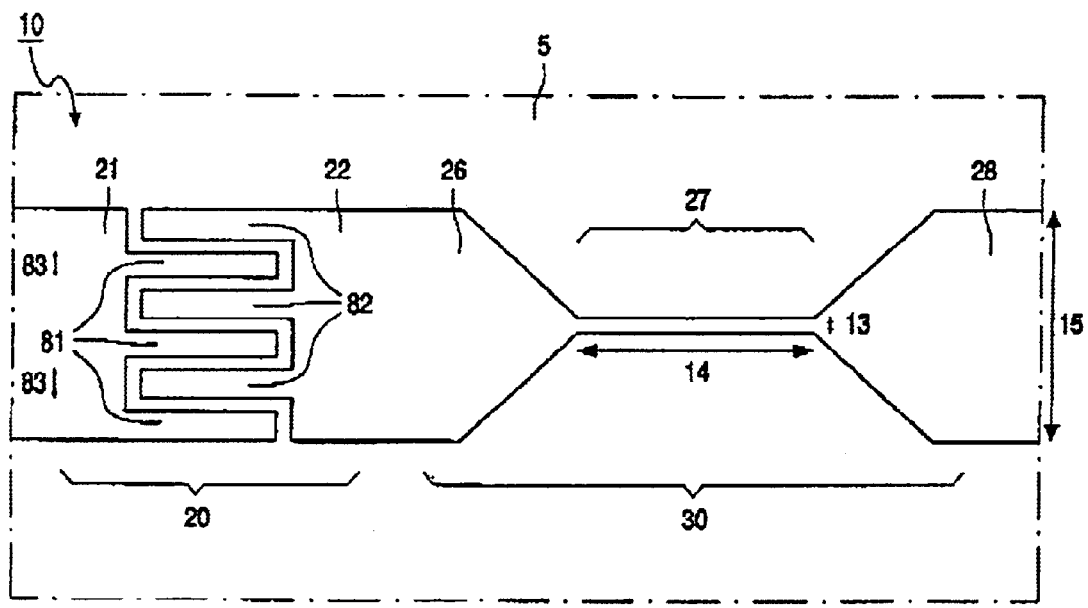
FIG. 2 is a plan view of the first embodiment.

The integrated circuit 10 in FIG. 1 and FIG. 2 is provided with a first memory element 30. This first memory element 30 comprises a first electrode 26, a bridge 27, and a second electrode 28. The memory element 30 lies on a laminate 12 with a thickness 16. The bridge 27 has a width 13 and a length 14. The width 13 is 1 $\mu$m, the length 14 is 20 $\mu$m. The width 15 of the electrodes 26 and 28 is 22 $\mu$m.

The integrated circuit 10 further comprises a first transistor 20 which is provided with a first (source) electrode 21, a drain electrode 22, and a gate electrode 25. The source electrode 21 has finger-shaped portions or digits 81 with a thickness 83 of 2 $\mu$m. The drain electrode 22 has digits 82 with a thickness 83 of 2 $\mu$m. The first transistor 20 is controlled via an electrical conductor track 23. The first memory element 30 is connected to the first transistor 20 via the first electrode 26. The source electrode 21, the drain electrode 22, and the memory element 30 are present in the first patterned layer 6 on the laminate 12. This laminate 12, which has a thickness 16 of 50 $\mu$m, comprises a semiconducting layer 5, a dielectric layer 4, a second patterned electrically conducting layer 3, and the substrate 11.

In this embodiment, the length 14 of the bridge 27 of the first memory element 30 is greater than the thickness 16 of the laminate 12 on which the memory element 30 is arranged. The heat transfer from the bridge 27 to the laminate 12 is limited thereby. The substrate 11 in this embodiment further comprises a porous layer 1 and a covering layer 2. The low mass of the porous layer 1 implies that the substrate 11 has a low absorption capacity for heat, so that the heat transfer from the bridge 27 to the laminate 12 is further limited. The electrical conductor track 23 is present between the substrate 11 and the first patterned layer 6, such that perpendicular projections of the conductor track 23 and of the bridge 27 on the substrate 11 have a mutual overlap. The electrical conductor track 23 thus serves not only as an interconnect but also as a preheating element for the bridge 27.

The IC 10 is manufactured in layers. The layer 2 was deposited on the porous layer 1 which comprises poly (etherimide). The substantially closed covering layer 2 comprises polyvinylphenol and the cross-linking agent hexamethoxymethylenemelamine (HMMM). The layer 2 was cross-linked at 125° C. in a nitrogen atmosphere in the presence of HCl gas. This completed the substrate 11. The second patterned layer 3 was provided thereon by means of spin coating. The second patterned layer 3 comprises polyaniline, camphorsulfonic acid, and 1-hydroxycyclohexylphenylketone and was provided as a solution in m-cresol. The layer 3 was exposed to light of 240 nm in accordance with a desired pattern. The layer was washed with a mixture of n-methylpyrrolidone, m-cresol, and camphorsulfonic acid. A layer 4 was deposited on the patterned layer 3. The layer 4 comprises polyvinylphenol as a dielectric material and the cross-linking agent HMMM. The layer 4 was patterned through exposure and development and was planarized. Then a layer 5 of a precursor of poly(thienylene-vinylene) was subsequently provided on the layer 4 and converted into poly(thienylene-vinylene) through heating, which latter material is semiconducting. The first patterned layer 6 was provided thereon, this layer 6 having the same composition as the second patterned layer 3, but a different pattern owing to exposure. The patterned layer 6 has a square resistance of approximately 5 k$\Omega$/·. This completes the IC 10.

For programming, a voltage of 25 V is applied across the first memory element 30 for approximately 0.01 s. The current, which is at a level of $5\times10^{-6}$ A at a voltage of 0.1 V, rises to approximately $10^{-4}$ A at the voltage of 25 V. The bridge 27 is interrupted thereby, and the current drops to $10^{-10}$ A. The achieved temperature in the memory element is approximately 200° C. The bridge 27 is interrupted transversely to the longitudinal direction 14 of the bridge 27. The electrical conductor track 23 in the layer 3 also acts as a preheating element for the bridge 27 during programming of the memory element 30.

In an alternative embodiment, the width 13 of the bridge 27 is 2 $\mu$m. The length of the bridge 14 is 60 $\mu$m. The electrodes 26 and 28 each have a width 15 of 2 $\mu$m and a length of 20 $\mu$m. For programming, a voltage of 90 V is applied across the first memory element 30 for approximately 0.1 s. The current, which is at a level of $5\times10^{-6}$ A at a voltage of 0.1 V, rises to approximately $10^{-4}$ A at the voltage of 90 V. The bridge 27 is then substantially broken through, and the current drops to $10^{-7}$ A. The achieved temperature in the memory element is approximately 200° C. The bridge 27 is not entirely free of polymeric material after programming.

Figure 3:
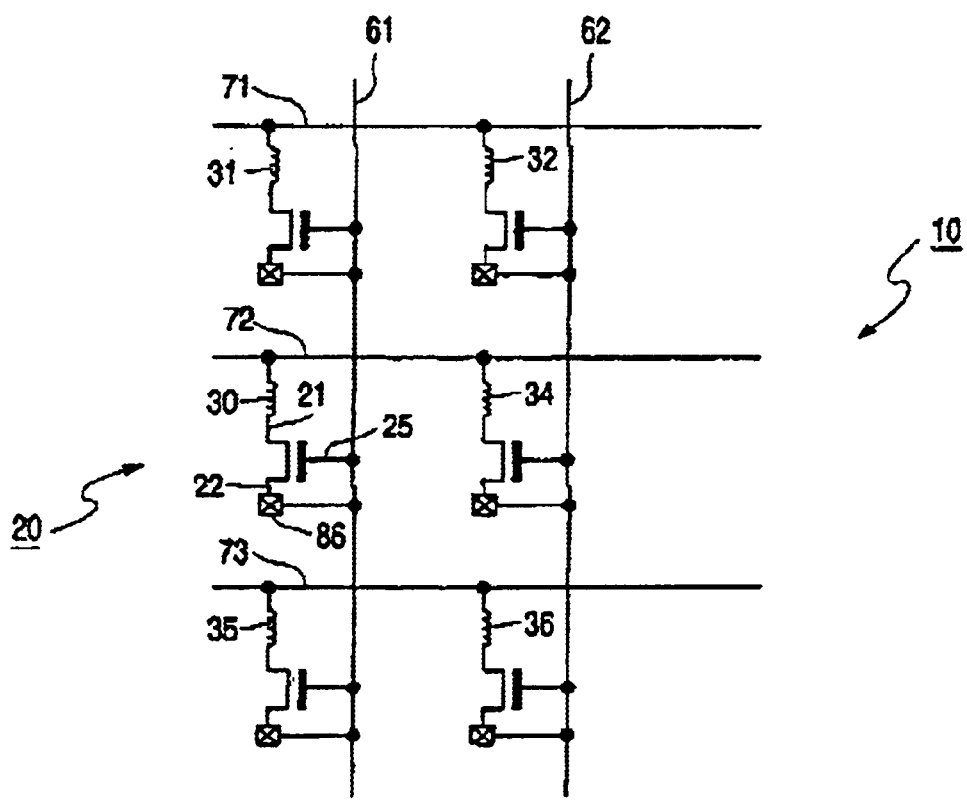
FIG. 3 is a circuit diagram of the first embodiment of the integrated circuit, comprising six memory elements.

FIG. 3 represents a circuit diagram of the first embodiment of the integrated circuit 10 according to the invention in which six memory elements 30, 31, 32, 34, 35, 36 are accommodated, which elements are arranged in a matrix of two word lines 61, 62 and three bit lines 71, 72, 73. The memory element 30 is present in a series arrangement with a transistor 20, which is capable of acting as a switch. The source electrode 22 and the gate electrode 25 of the transistor 20 are short-circuited by the via 86 and part of the word line 61. The transistor 20 further comprises a drain electrode 21 which is in contact with the memory element 30. The other memory elements 31, 32, 34, 35, 36 are present in similar series circuits. For the purpose of programming of the memory element 30, the bit lines 71 and 73 have a negative voltage, and the word line 61 has a negative voltage. The word line 62 and the bit line 72 are at 0 V. A voltage is thus present across the first memory element 30 which is sufficient for programming the memory element 30 from "1" to "0". There is no voltage across the other memory elements which is sufficiently high for programming them. A code generator is provided by means of the matrix which comprises an electrically programmable memory of 16 bits. The code generator may readily be arranged so as to contain a larger memory of 48, 64, or more bits.

Figure 4A:
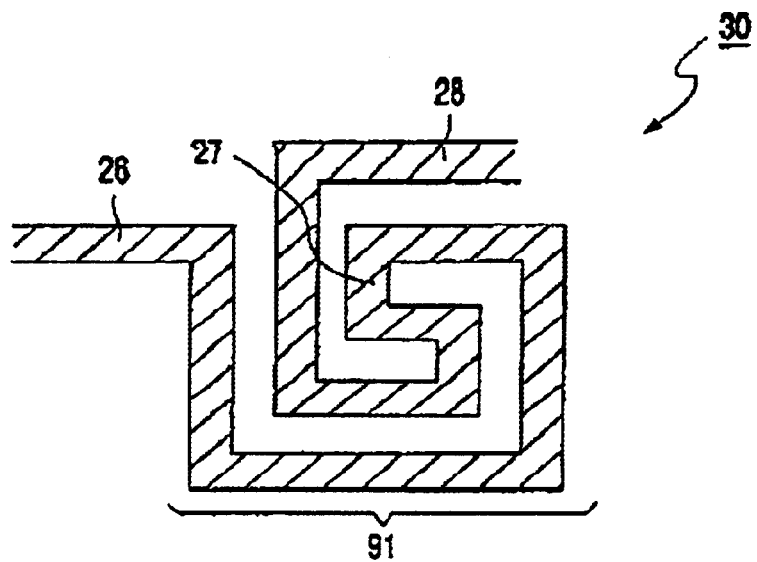
FIG. 4 is a diagrammatic plan view of electrical conductor tracks which may serve as bridges in the first memory element for the purpose of reducing the heat transfer.
Figure 4B:
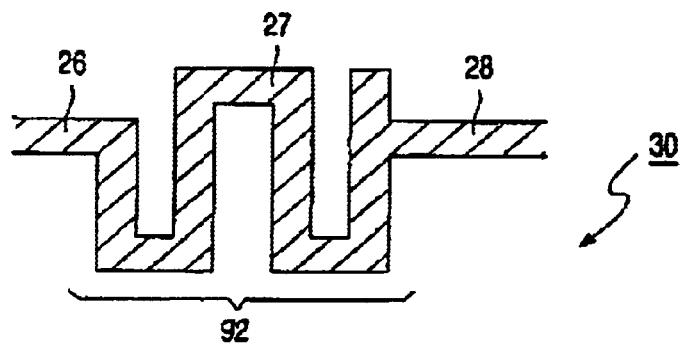

FIG. 4 shows a few examples of shapes which the first memory element 30 in the IC 10 according to the invention may have for the purpose of reducing the heat transfer to portions of the IC 10 outside the first memory element 30. FIG. 4a shows a spiraling electrical conductor track 91 and FIG. 4b shows a meandering electrical conductor track 92. These conductor tracks have the function of the bridge 27 in the first memory element 30, their ends being the electrodes 26 and 28. The conductor tracks 91, 92 are manufactured in a patterned layer of poly(3,4-ethylenedioxythiophene) and polystyrenesulfonic acid. The width of the conductor tracks 91, 92 shown is 2 $\mu$m. The distance between adjoining portions of the conductor tracks 91, 92 is also 2 $\mu$m.

Figure 5:
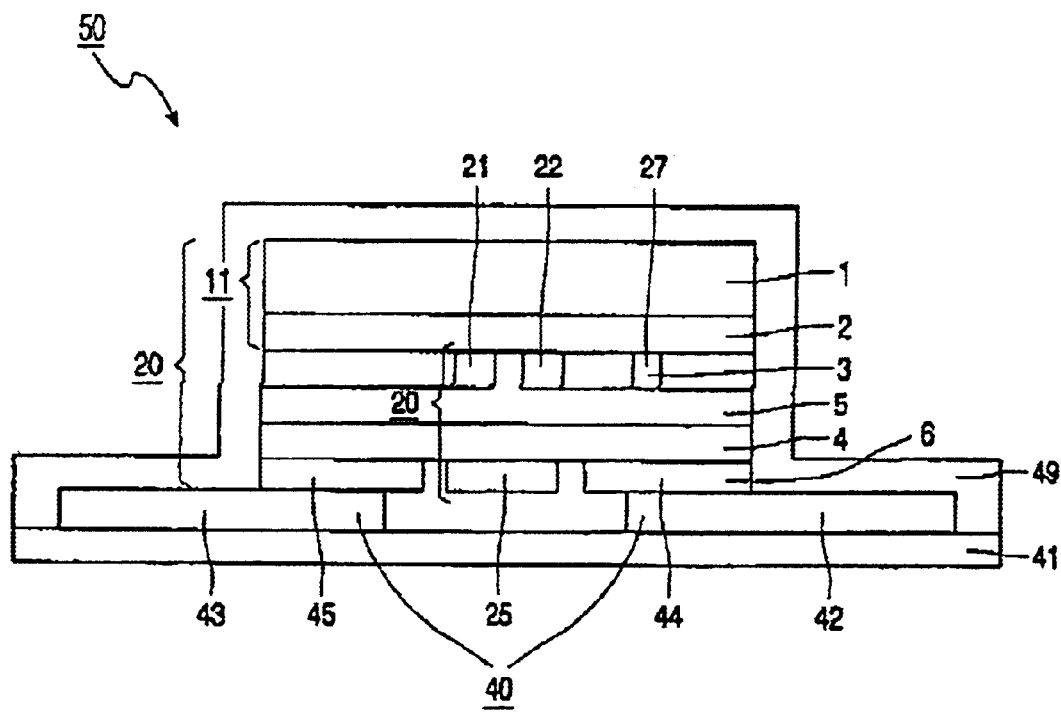
FIG. 5 is a diagrammatic side elevation of the transponder.
Figure 6A:
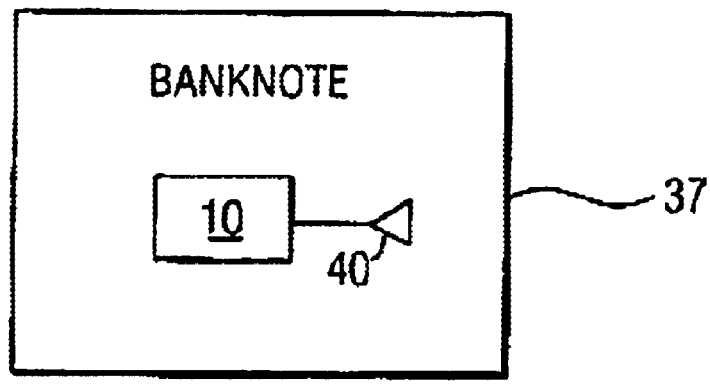
FIG. 6A illustrates security paper as a banknote including an integrated circuit according to the present invention.
Figure 6B:
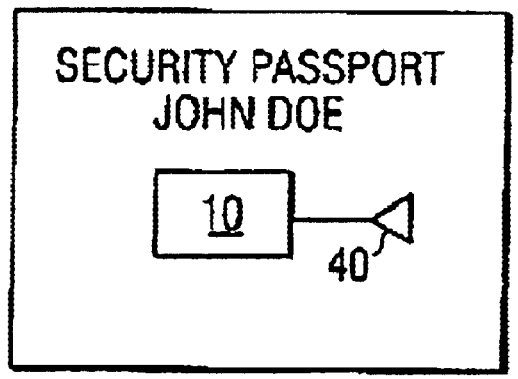
FIG. 6B shows another example of security paper having an integrated circuit according to the present invention.

The transponder 50 of FIG. 5 comprises an integrated circuit 10 and an antenna 40. The antenna 40 comprises a first capacitor electrode 42 and a second capacitor electrode 43 which couple the transponder 50 capacitively to a base station. The first and second capacitor electrodes 42, 43 also serve as a first and second contact pad, respectively. The antenna 40 lies on a second substrate 41 of polyimide, and the integrated circuit 10 lies on a substrate 11 which comprises a porous layer 1 and a covering layer 2. The antenna 40 is connected to the IC 10 by means of a circuit which comprises inter alia the third and fourth contact pads 44 and 45. The contact pads 44 and 45 form part of the second patterned layer 6 which in this embodiment also comprises the gate electrode 25 of the first transistor 20. An additional stack of layers may possibly be present between the layer in which the gate electrode 25 lies and the layer of which the contact pads 44 and 45 form part. The contact pads 44 and 45 in that case may at the same time serve as capacitor electrodes of one or several capacitors present in the transponder. An electrically insulating layer 4 and a semiconductor layer 5 are present between the gate electrode 25 on the one hand and a source electrode 21 and drain electrode 22 of the first transistor 20 on the other hand. The source 21 and drain electrode 22 lie in the first patterned layer 3 which also comprises the first memory element 30, the bridge 27 thereof being indicated in the drawing. The first electrically conducting patterned layer 3 and the second electrically conducting patterned layer 6 comprise poly(3,4-ethylenedioxythiophene).

The antenna 40 and the integrated circuit 10 are manufactured independently of one another in the manufacture of the transponder 50, whereupon they are sandwiched together by their sides facing away from the substrate. To achieve a good electrical contact between the first 42 and the third contact pad 44, as well as between the second 43 and the fourth contact pad 45, a conductive adhesive material is provided on the contact surfaces. The transponder 50 is surrounded by a protective layer 49 of polyimide and by the second substrate 41.

What is claimed is:

1. An integrated circuit provided with a substrate and with a memory having a first heat-programmable memory element, which memory element comprises:

a first electrode and a second electrode;

an electrically conducting bridge providing an electrical path between said first electrode and said second electrode;

wherein said electrically conducting bridge comprises an electrically conducting organic material, the bridge having both a non-programmed state and a programmed state, wherein in a non-programmed state the bridge comprises a first conduction state in which a first conduction current level flows through the organic material between the first electrode and the second electrode of the memory element below a transition temperature, and a programmed state comprises a second conduction state in which the current level flows through the organic material by at least a predetermined amount less than said first conduction current level when the organic material is above said transition temperature, wherein the organic material is programmed by heating the memory element to said transition temperature that reduces conduction through predetermined portions thereof to;

said bridge is at least partly interrupted in the programmed state so that conduction therein is reduced from when said bridge was in the non-programmed state.

2. An integrated circuit as claimed in claim 1, wherein a first transistor is present which during programming provides a voltage across the first memory element so as to heat the first memory element.

3. An integrated circuit as claimed in claim 1, further comprising an electrical conductor track being arranged therein for limiting heat dissipation from the bridge, perpendicular projections of said conductor track and of the bridge on the substrate overlapping each other.

4. An integrated circuit as claimed in claim 1, wherein the substrate is a laminated product of a porous layer and a covering layer.

5. An integrated circuit as claimed in claim 1, wherein the first memory element has a spiraling or meandering shape.

6. An integrated circuit as claimed in claim 1, wherein the first memory element is also programmable by optical means.

7. An integrated circuit as claimed in claim 2, wherein a first patterned electrically conducting layer is present on a substrate, in which layer the bridge of the memory element and a first transistor electrode of the first transistor are present.

8. An integrated circuit as claimed in claim 7, wherein the bridge is adapted to function as a conductor track that limits heat dissipation by having a smaller width than the first transistor electrode of the first transistor and than the first electrode of the first memory element.

9. An integrated circuit as claimed in claim 7, wherein the first patterned layer comprises an organic material chosen from the group of polyaniline and poly(3,4-ethylenedioxythiophene).

10. A transponder comprising an integrated circuit and an antenna, and an electrically conducting connection between the antenna wherein the integrated circuit as claimed in claim 1 is present.

11. A security paper comprising an integrated circuit, wherein the integrated circuit as claimed in claim 1 is present.

* * * * *